(12) United States Patent
Kano

(10) Patent No.: US 6,337,508 B1
(45) Date of Patent: Jan. 8, 2002

(54) TRANSISTOR WITH A QUANTUM-WAVE INTERFERENCE LAYER

(75) Inventor: Hiroyuki Kano, Aichi-ken (JP)

(73) Assignee: Canare Electric Co., Ltd., Aichi-gun (JP)

(*) Notice: Subject to any disclaimer, the term of this patent is extended or adjusted under 35 U.S.C. 154(b) by 0 days.

(21) Appl. No.: 09/425,737

(22) Filed: Oct. 22, 1999

(30) Foreign Application Priority Data

Oct. 23, 1998 (JP) .......................... H10-302690

(51) Int. Cl.[7] ................ H01L 29/737; H01L 29/772; H01L 29/15
(52) U.S. Cl. ................ 257/592; 257/15; 257/17; 257/20; 257/24; 257/187; 257/192; 257/197
(58) Field of Search ................ 257/9, 12, 14–22, 257/24–27, 29, 183, 187, 192, 197, 198, 565, 592, 593, 613–616

(56) References Cited

U.S. PATENT DOCUMENTS

| | | | | |
|---|---|---|---|---|
| 4,771,326 A | * | 9/1988 | Curran | 357/34 |
| 4,914,488 A | * | 4/1990 | Yamane et al. | 357/4 |
| 5,389,798 A | * | 2/1995 | Ochi et al. | 257/25 |
| 5,414,273 A | * | 5/1995 | Shimura et al. | 257/17 |
| 5,543,749 A | * | 8/1996 | Awano | 327/570 |
| 5,932,890 A | * | 8/1999 | Irikawa et al. | 257/15 |
| 6,175,123 B1 | * | 1/2001 | Kano | 257/9 |

OTHER PUBLICATIONS

Beltram et al., "Continuum–Miniband Superlattice–Based Transistor with Graded Electron Injector," Electronics Letters, Aug. 31st 1989, vol. 25, No. 18, pp. 1219–1220.*

Beltram et al., "Injection in a continuum miniband: Observation of negative transconductance in a ssuperlattice–base transistor," Appl. Phys. Lett. 55 (15), Oct. 9, 1989, pp. 1534–1536.*

* cited by examiner

*Primary Examiner*—Eddie Lee
*Assistant Examiner*—Bradley W. Baumeister
(74) *Attorney, Agent, or Firm*—Oblon, Spivak, McClelland, Maier & Neustadt, P.C.

(57) ABSTRACT

A transistor having an electron quantum-wave interference layer with plural periods of a pair of a first layer W and a second layer B in a p-layer of a pn junction structure. The second layer B has wider band gap than the first layer W. Each thicknesses of the first layer W and the second layer B is determined by multiplying by an odd number one fourth of quantum-wave wavelength of carriers in each of the first layer W and the second layer B, the carriers existing around the lowest energy level of the second layer B. The quantum-wave interference layer functions as an electron reflecting layer, and enables to lower a dynamic resistance of the transistor notably. An amplification factor of a bipolar transistor of an npn junction structure, having the electron reflecting layer is improved compared with a transistor without an electrode reflecting layer. Similarly, a transistor having a hole reflecting layer, which has a larger amplification factor, can be obtained. Forming a hole reflecting layer can be applied to a field effect transistor such as a MESFET.

19 Claims, 13 Drawing Sheets

TRANSISTOR WITH A QUANTUM-WAVE INTERFERENCE LAYER

BACKGROUND OF THE INVENTION

1. Field of the Invention

The present invention relates to a transistor having a new junction structure with whose dynamic resistance is lowered.

2. Description of the Related Art

Bipolar transistors which has a pnp or an npn junction structure have been known. Electric current, which flows when the forward voltage is applied to the transistor having a pn junction structure, increases rapidly at the point where the forward voltage exceeds the potential difference between the conduction bands of p and n layers. The larger gradient of the characteristic carve between electric current and voltage in the dynamic range is, the more suitable the transistor becomes to use as various devices.

However, a problem persists in the gradient. The gradient of electric current and voltage characteristics could not be varied because it is determined by materials which form the transistor. Therefore, further improvement has been required, as presently appreciated by the present inventors.

As a countermeasure, reflecting carriers by forming cladding layers with a multi-quantum well structure of a first and a second layers as a unit in a laser diode (LD) has been suggested by Takagi et al. (Japanese Journal of Applied Physics. Vol.29, No.11, November 1990, pp.L1977–L1980). Although it can be led that a band gap energy is used as an alternative of a kinetic energy, this reference does not teach or suggest values of kinetic energy of carriers to be considered and the degree of luminous intensity improvement is inadequate.

SUMMARY OF THE INVENTION

The inventor of the present invention conducted a series of experiments and found that the suggested thicknesses of the first and the second layers by Takagi et al. were too small to reflect carriers, and that preferable thicknesses of the first and second layers are 4 to 6 times larger than those suggested by Takagi et al. Further, the present inventors thought that multiple reflection of quantum-waves of carriers might occur by a multi-layer structure with different band width, like multiple reflection of light by a dielectic multi-film structure. And the inventors thought that it would be possible to vary the I-V characteristic of carriers when the external voltage is applied to the device by the quantum-wave reflection. As a result, the inventors invented a preferable quantum-wave interference layer and applications of the same.

It is, therefore, an object of the present invention to provide a transistor having a junction structure with considerably lower dynamic resistance by forming a quantum-wave interference layer.

In light of these objects a first aspect of the present invention is a transistor constituted by forming a quantum-wave interference layer having plural periods of a pair of a first layer and a second layer in a base region or a channel region, the second layer having a wider band gap than the first layer. Each thickness of the first and the second layers is determined by multiplying by an odd number one fourth of quantum-wave wavelength of injected minority carriers in each of the first and the second layers.

The second aspect of the present invention is a transistor constituted by a quantum-wave interference layer having plural periods of a pair of a first layer and a second layer in a base region or a channel region. The second layer has a wider band gap than the first layer. A δ layer is included for sharply varying energy band and is formed between the first and the second layers. Each thickness of the first and the second layers is determined by multiplying by odd number one fourth of quantum-wave wavelength of injected minority carriers in each of the first and the second layers, and a thickness of the δ layer is substantially thinner than that of the first and the second layers.

The third aspect of the present invention is a transistor having injected carriers existing around the lowest energy level of the second layer.

The fourth aspect of the present invention is to define each thickness of the first and the second layers as follows:

$$D_W = n_W \lambda_W/4 = n_W h/4[2m_W(E+V)]^{1/2} \qquad (1)$$

and $$D_B = n_B \lambda_B/4 = n_B h/4(2m_B E)^{1/2} \qquad (2)$$

In Eqs. 1 and 2, h, $m_W$, $m_B$, E, V, and $n_W$, $n_B$ represent a Plank's constant, effective mass of minority carriers injected into the first layer, effective mass of minority carriers in the second layer, kinetic energy of minority carriers injected into the second layer, potential energy of the second layer to the first layer, and odd numbers, respectively. An minority carriers injected into the second layer are preferably existing around the lowest energy level of the second layer.

The fifth aspect of the present invention is a transistor having a plurality of partial quantum-wave interference layers $I_k$ in a base region or a channel region with arbitrary periods $T_k$ including a first layer having a thickness of $D_{Wk}$ and a second layer having a thickness of $D_{Bk}$ and arranged in series. The thicknesses of the first and the second layers satisfy the formulas:

$$D_{Wk} = n_{Wk} \lambda_{Wk}/4h/4 = n_{Wk} h/4[2m_{Wk}(E_k+V)]^{1/2} \qquad (3)$$

and $$D_{Bk} = n_{Bk} \lambda_{Bk}/4 = n_{Bk} h/4(2m_{Bk} E_k)^{1/2} \qquad (4)$$

In Eqs. 3 and 4, $E_k$, $m_{Wk}$, $m_{Bk}$, and $n_{Wk}$ and $n_{Bk}$ represent plural kinetic energy levels of minority carriers injected into the second layer, effective mass of minority carriers with kinetic energy $E_k+V$ in the first layer, effective mass of minority carriers with kinetic energy $E_k$ in the second layer, and arbitrary odd numbers, respectively.

The plurality of the partial quantum-wave interference layers $I_k$ are arranged in series from $I_1$, to $I_j$, where j is a maximum number of k required to form a quantum-wave interference layer as a whole.

The sixth aspect of the present invention is a transistor having a quantum-wave interference layer with a plurality of partial quantum-wave interference layers arranged in series with arbitrary periods. Each of the plurality of partial quantum-wave interference layers is constructed with serial pairs of the first and second layers. The widths of the first and second layers of the serial pairs are represented by $(D_{W1}, D_{B1}), \ldots (D_{Wk}, D_{Bk}), (D_{Wj}, D_{Bj})$. $(D_{Wk}, D_{Bk})$ is a pair of widths of the first and second layers and is defined as Eqs. 3 and 4, respectively.

The seventh aspect of the present invention is to form a δ layer between a first layer and a second layer which sharply varies the energy band and has a thickness substantially thinner than that of the first and the second layers.

The eighth aspect of the present invention is to constitute a quantum-wave incident facet in the quantum-wave interference layer by a second layer with enough thickness for preventing conduction of minority carriers injected into the first layer by a tunneling effect.

The ninth aspect of the present invention is a bipolar transistor having the quantum-wave interference layer in a base region.

The tenth aspect of the present invention is a field effect transistor having the quantum-wave interference layer in a channel region.

FIRST, THIRD AND FOURTH ASPECTS OF THE PRESENT INVENTION

Figure 1:
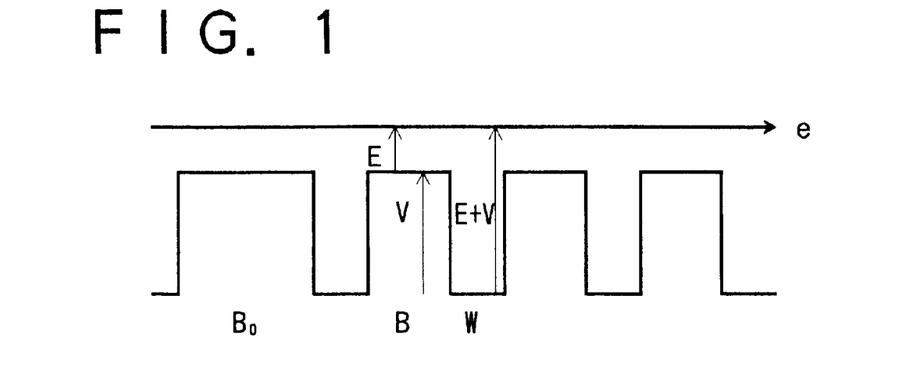
FIG. 1 is an explanatory view of a conduction band of a multi-layer structure according to the first, third, and fourth aspects of the present invention.

The principle of the quantum-wave interference layer in a pn junction structure of, for example, npn-transistor according to the present invention is explained hereinafter. FIG. 1 shows a conduction band of a multi-layer structure, formed in a p-layer, i.e., in a base or channel area, with plural periods of a pair of a first layer W and a second layer B. A band gap of the second layer B is wider than that of the first layer W. Electrons, or minority carriers, which have been injected into the p-layer, conduct from left to right as shown by an arrow in FIG. 1. Among the electrons, those that existing around the bottom of the second layer B are likely to contribute to conduction. The electrons around the bottom of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure.

When thickness of the first layer W and the second layer B are equal to order of a quantum-wave wavelength, electrons tend to have characteristics of a wave. The wave length of the electron quantum-wave is calculated by Eqs. 1 and 2 using kinetic energy of the electron. Further, defining the respective wave number vector in first layer W and second layer B as $K_W$ and $K_B$, reflectivity R of the wave is calculated by:

$$R = (|K_W| - |K_B|)/(|K_W| + |K_B|) \quad (5)$$
$$= [\{m_W(E+V)\}^{1/2} - [m_B E]^{1/2}]/[\{m_W(E+V)\}^{1/2} + (m_B E)^{1/2}]$$
$$= [1 - \{m_B E/m_W(E+V)\}^{1/2}]/[1 + \{m_B E/m_W(E+V)\}^{1/2}].$$

Further, when $m_B = m_W$, the reflectivity R is calculated by:

$$R = [1 - \{E/(E+V)\}^{1/2}]/[1 + \{E/(E+V)\}^{1/2}] \quad (6).$$

When E/(E+V)=x, Eq. 6 is transformed into:

$$R = (1 - x^{1/2})/(1 + x^{1/2}) \quad (7).$$

Figure 2:
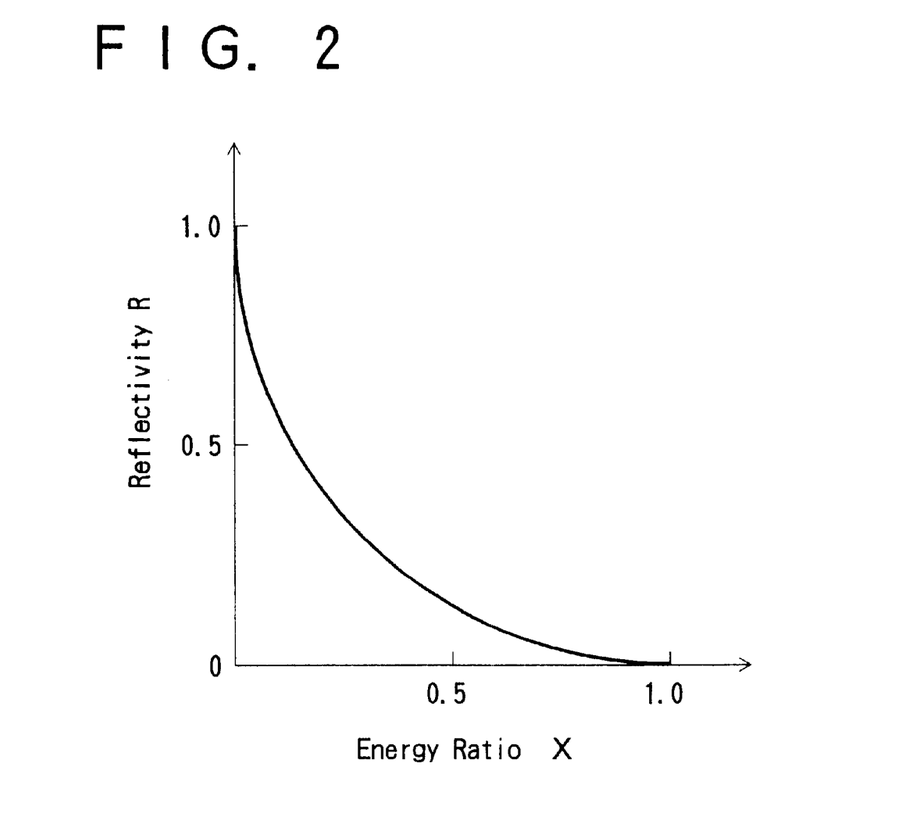
FIG. 2 is a graph showing a relation between an energy ratio x and a reflectivity R.

The characteristic of the reflectivity R with respect to energy ratio x obtained by Eq. 7 is shown in FIG. 2.

When the second layer B and the first layer W have S periods, the reflectivity $R_S$ on the incident facet of a quantum-wave is calculated by:

$$R_S = [(1-x^S)/(1+x^S)]^2 \quad (8).$$

When the formula $x \leq 1/10$ is satisfied, $R \geq 0.52$. Accordingly, the relation between E and V is satisfied with:

$$E \leq V/9 \quad (9)$$

Since the kinetic energy E of conducting electrons in the second layer B exists around the bottom of the conduction band, the relation of Eq. 9 is satisfied and the reflectivity R at the interface between the second layer B and the first layer W becomes 52% or more. Consequently, the multi-quantum well structure having two kinds of layers with different band gaps to each other enables to reflect quantum-wave of the electrons injected into the p-layer effectively.

Further, utilizing the energy ratio x enables thickness ratio $D_B/D_W$ of the second layer B to the first layer W to be obtained by:

$$D_B/D_W = [m_W/(m_B x)]^{1/2} \quad (10).$$

Until the kinetic energy of electrons injected into a p-layer exceeds the level used to design a thickness of a quantum-wave interference layer in a pn junction of a transistor substantially when the external voltage is applied between base and emitter of the transistor having a quantum-wave interference layer in the p-layer, electrons are reflected and do not cause electric currency. When the kinetic energy of the electrons exceeds the energy level of designed substantially, reflected electrons begin to flow rapidly. Consequently, I-V characteristic of the pn junction of the transistor varies sharply, or a dynamic resistance of the transistor drops.

Thicknesses of the first layer W and the second layer B are determined for selectively reflecting either one of holes and electrons, because of a difference in potential energy between the valence and the conduction bands, and a difference in effective mass of holes and electrons in the first layer W and the second layer B. Namely, the optimum thickness for reflecting electrons is not optimum for reflecting holes. Eqs. 5–10 refer to a structure of the quantum-wave interference layer for reflecting electrons selectively. The thickness for selectively reflecting electrons is designed based on a difference in potential energy of the conduction band and effective mass of electrons.

Further, the thickness for selectively reflecting holes is designed based on a difference in potential energy of the valence band and effective mass of holes, realizing another type of quantum-wave interference layer for reflecting only holes and allowing electrons to pass through.

Forming the quantum-wave interference layer of electrons in the p-layer and that of holes in the n-layer enables to vary I-V characteristic of the pn junction of the transistor more abruptly and lower its dynamic resistance notably.

Here a junction type transistor having a p-layer as a base area is explained. Alternatively, a FET having a p-layer as a channel can be applied. And an npn-type transistor is explained. Alternatively, a pnp-type transistor can be applied.

FIFTH ASPECT OF THE PRESENT INVENTION

Figure 3:
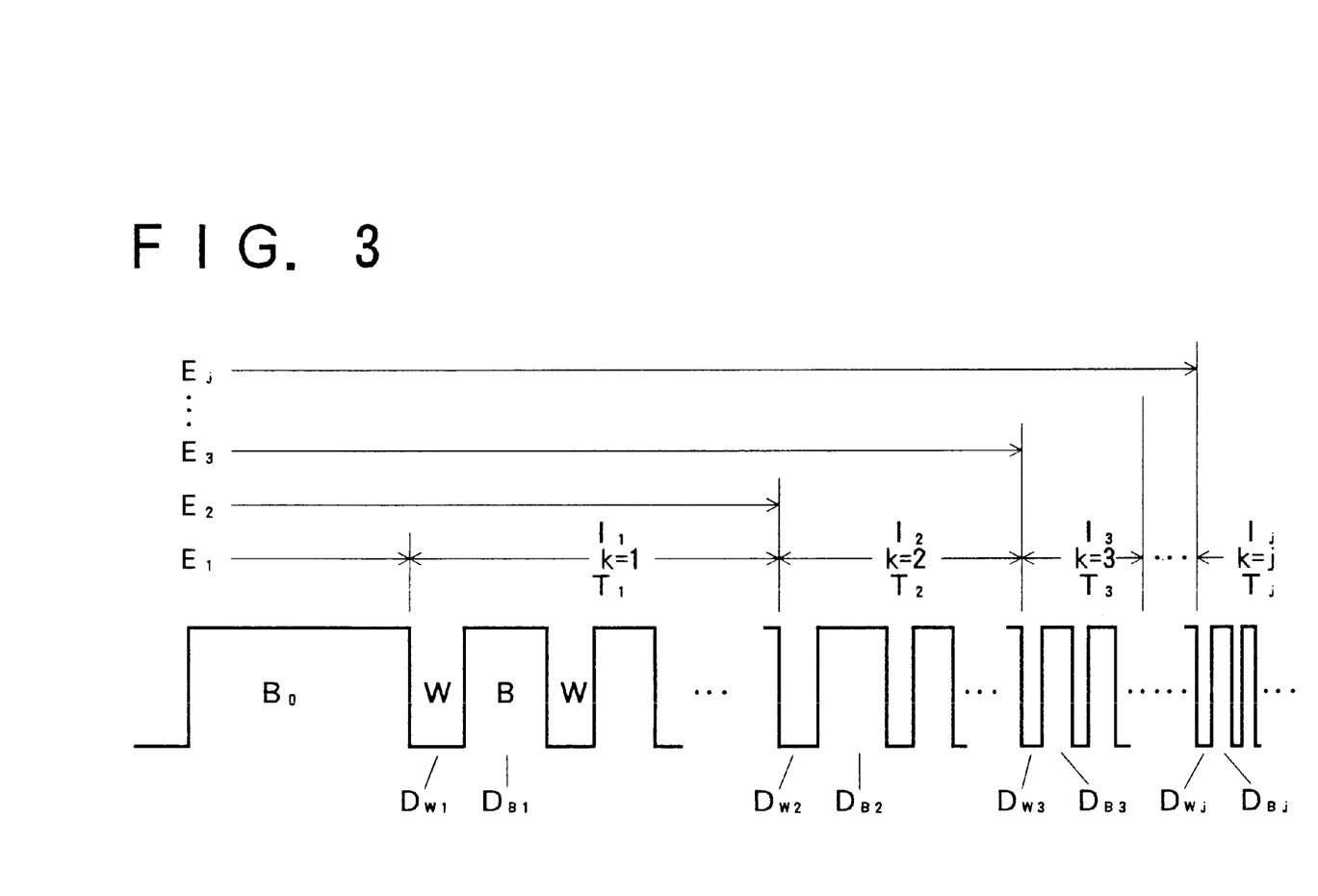
FIG. 3 is an explanatory view of partial quantum-wave interference layers $I_k$ according to the fifth aspect of the present invention.

As shown in FIG. 3, a plurality of partial quantum-wave interference layers $I_k$ may be formed corresponding to each of a plurality of kinetic energy levels $E_k$. Each of the partial quantum-wave interference layers $I_k$ has $T_k$ periods of a pair of a first layer W and a second layer B whose respective thicknesses ($D_{Wk}$, $D_{Bk}$) are determined by Eqs. 3 and 4. The plurality of the partial quantum-wave interference layer $I_k$ is arranged in series with respect to the number k of kinetic energy levels $E_k$. That is, the quantum-wave interference layer is formed by a serial connection of $I_1, I_2, \ldots,$ and $I_j$. As shown in FIG. 3, electrons with each of the kinetic energy levels $E_k$ are reflected by the corresponding partial quantum-wave interference layers $I_k$. Accordingly, electrons belonging to each of the kinetic energy levels from $E_1$ to $E_j$ are reflected effectively. By designing the intervals between the kinetic energies to be short, thicknesses of the first layer W and the second layer B ($D_{Wk}$, $D_{Bk}$) in each of the partial quantum-wave interference layers $I_k$ vary continuously with respect to the value k.

SIXTH ASPECT OF THE PRESENT INVENTION

Figure 4:
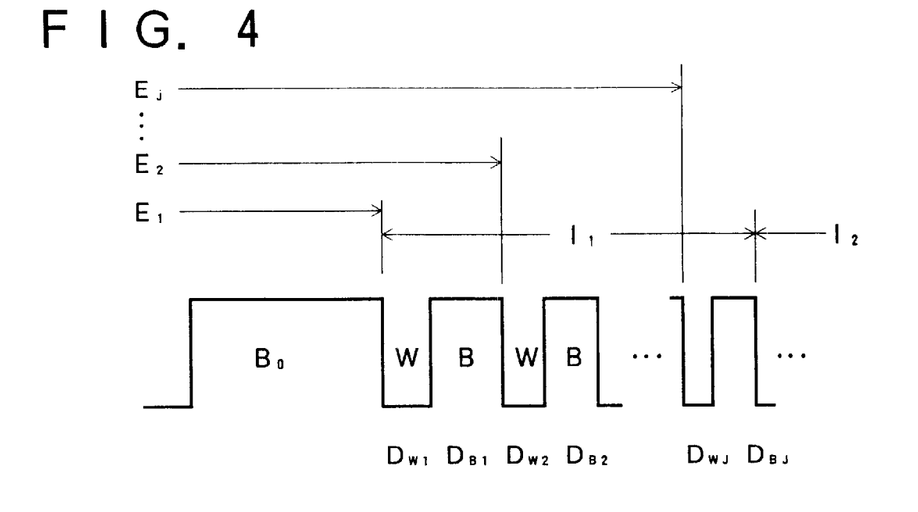
FIG. 4 is an explanatory view of partial quantum-wave interference layers $I_k$ according to the sixth aspect of the present invention.

As shown in FIG. 4, a plurality of partial quantum-wave interference layers may be formed with an arbitrary period. Each of the partial quantum-wave interference layers, $I_1$, $I_2$, ... is made of serial pairs of the first layer W and the second layer B with widths ($D_{Wk}$, $D_{Bk}$) determined by Eqs. 3 and 4. That is, the partial quantum-wave interference layer, e.g., $I_1$, is constructed with serial layers of width ($D_{W1}$, $D_{B1}$), ($D_{W2}$, $D_{B2}$), ... ($D_{Wj}$, $D_{Bj}$), as shown. A plurality $I_1$, $I_2$, ... of layers such as layer $I_1$ are connected in series to form the total quantum-wave interference layer. Accordingly, electrons of the plurality of kinetic energy levels $E_k$ are reflected by each pair of layers in each partial quantum-wave interference layers. By designing the intervals between kinetic energies to be short, thicknesses of the pair of the first layer W and the second layer B ($D_{Wk}$, $D_{Bk}$) in a certain partial quantum-wave interference layer varies continuously with respect to the value k.

SECOND AND SEVENTH ASPECTS OF THE PRESENT INVENTION

The second and seventh aspects of the present invention are directed forming a δ layer at the interface between the first layer W and the second layer B. The δ layer has a relatively thinner thickness than both of the first layer W and the second layer B and sharply varies an energy band. Reflectivity R of the interfaces determined by Eq. 7. By forming the δ layer, the potential energy V of an energy band becomes larger and the value x of Eq. 7 becomes smaller. Accordingly, the reflectivity R becomes larger. Also, by sharply varying the band gap of the interfaces, the potential energy V of an energy band becomes larger and the value x of Eq. 7 becomes smaller. Without forming a δ layer, a part of component of the first layer W and the second layer B mixes when the second layer B is laminated on the first layer W, and an energy band gap which varies sharply cannot be obtained. When a δ layer is formed at each interfaces of the first and the second layers, even if a part of component of the first layer W and the second layer B mixes, an energy band gap varies sharply compared with the case without δ layers.

Figure 5A:
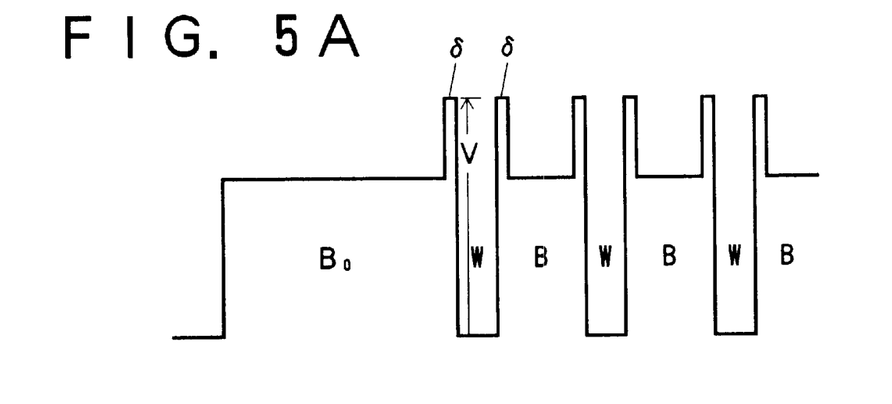
FIGS. 5A–5C are explanatory views of δ layers according to the second and seventh aspects of the present invention.
Figure 5B:
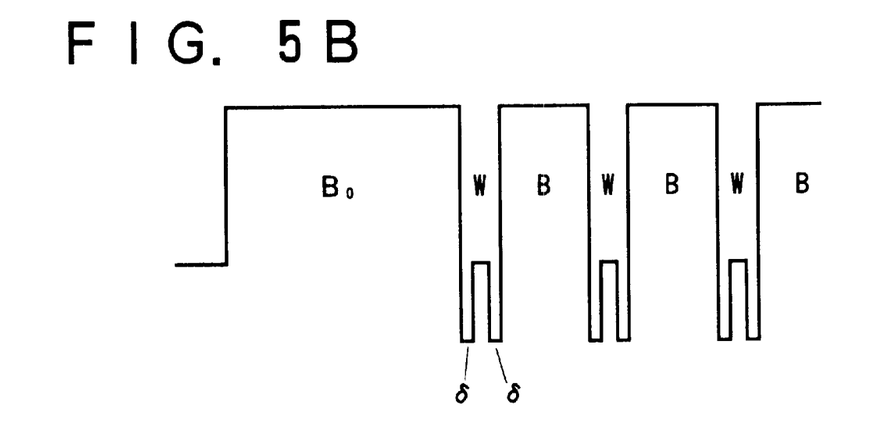
Figure 5C:
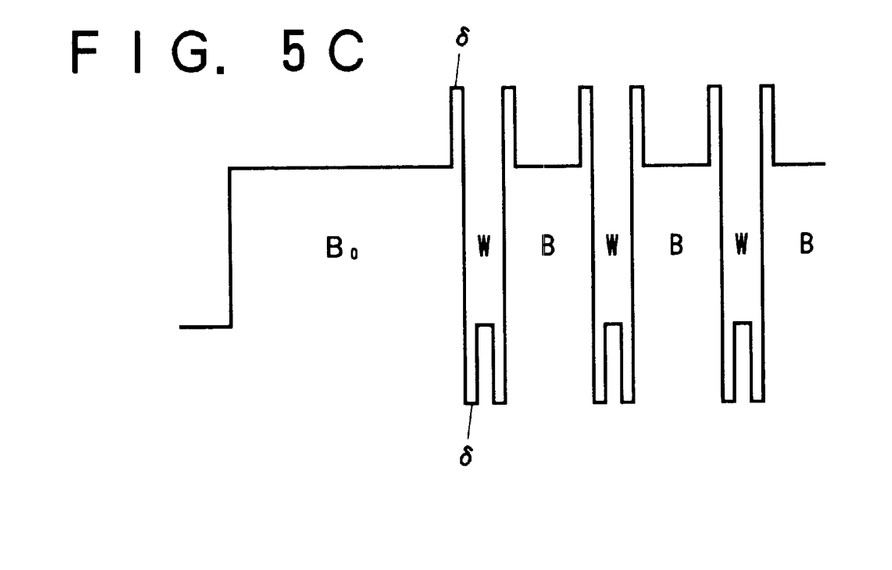

Variations are shown in FIGS. 5A to 5C. The δ layer may be formed on both ends of the every first layer W as shown in FIGS. 5A to 5C. In FIG. 5A, the δ layers are formed so that an energy level higher than that of the second layer B may be formed. In FIG. 5B, the δ layers are formed so that a band having lower bottom than that of the first layer W may be formed. In FIG. 5C, the δ layers are formed so that the energy level higher than that of the second layer B and the energy level lower than that of the first layer W may be formed. As an alternative to each of the variations shown in FIGS. 5A to 5C, the δ layer can be formed on one end of the every first layer W.

Forming one δ layer realizes large quantum-wave reflectivity at the interface between the first layer W and the second layer B and a plurality of the δ layers realizes a larger reflectivity as a whole.

EIGHTH ASPECT OF THE PRESENT INVENTION

The eighth aspect of the present invention, or forming a thick second layer $B_0$ at the side of an incident plane of the quantum-wave interference layer, and effectively prevents conduction by tunneling effects and reflects carriers.

NINTH AND TENTH ASPECTS OF THE PRESENT INVENTION

As described above, by forming a quantum-wave interference layer as an electron reflecting layer in a pn junction of the transistor, I-V characteristic of the pn junction varies sharply. And by applying the range of its I-V characteristic which varies sharply to a base voltage and a collector current of a bipolar transistor or a gate voltage and a drain current of a field effect transistor, a transistor having a larger amplification factor than that of a conventional transistor can be obtained.

And by forming a quantum-wave interference layer as a hole reflecting layer in the n-layer, i.e., in a base or channel area, of a pn junction of the transistor, I-V characteristic of the pn junction varies sharply. Also, by applying the range of its I-V characteristic which varies sharply to a base voltage and a collector current of a bipolar transistor or a gate voltage and a drain current of a field effect transistor, a transistor having a larger amplification factor than that of a conventional transistor can be obtained.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

The invention will be more fully understood by reference to the following examples.

EXAMPLE 1

Figure 6:
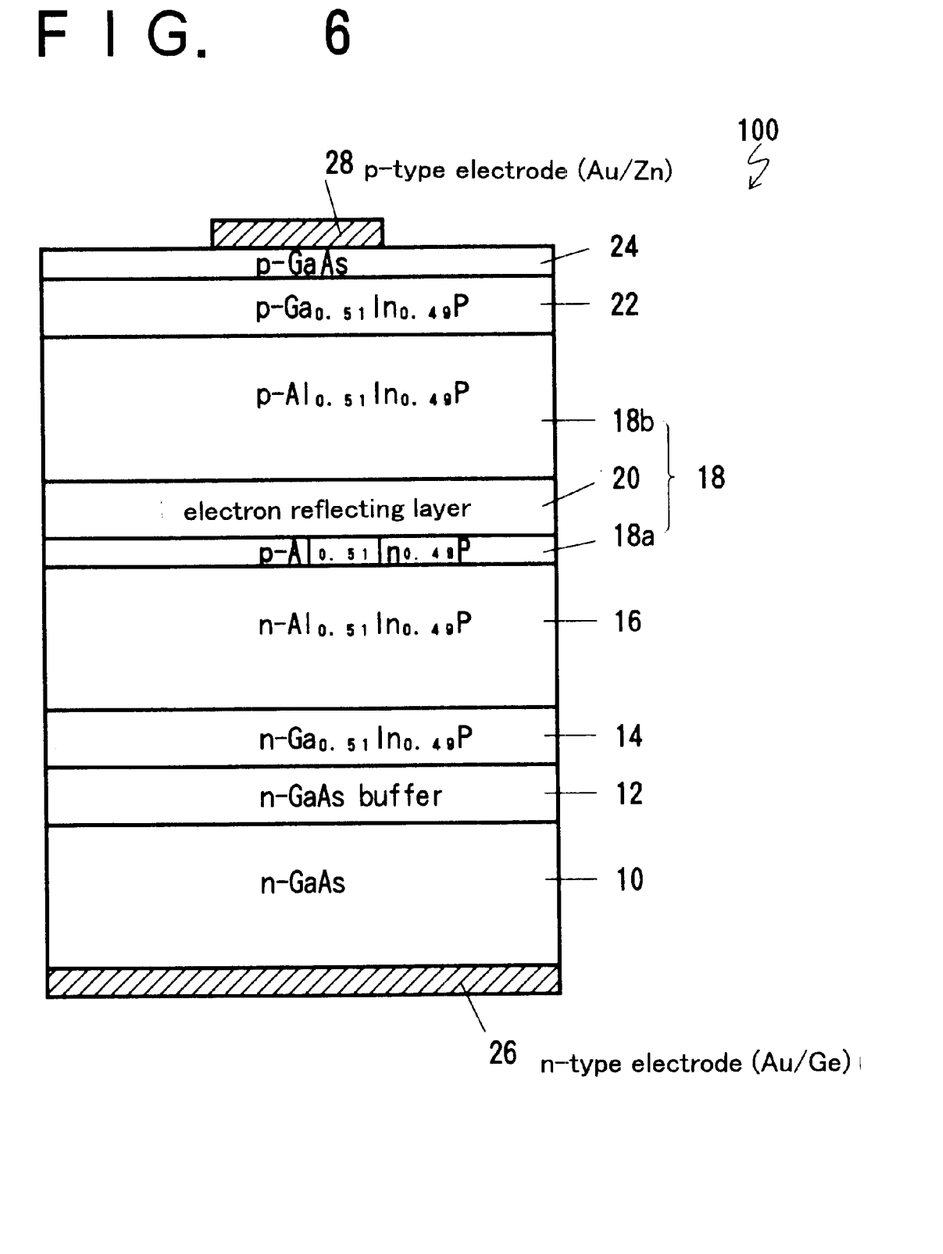
FIG. 6 is a sectional view showing a first exemplary structure of a pn junction device 100 (Example 1)

FIG. 6 is a sectional view of a pn junction device 100 in which a quantum-wave interference layer is formed in a p-layer. The device 100 has a substrate 10 made of gallium arsenide (GaAs). An n-GaAs buffer layer 12 having a thickness generally of 0.3 μm and an electron concentration of $2\times10^{18}/cm^3$ is formed on the substrate 10. An n-$Ga_{0.51}In_{0.49}P$ contact layer 14 of n-type conduction, having a thickness generally of 0.1 μm and electron concentration of $2\times10^{18}/cm^3$, is formed on the buffer layer 12. An n-$Al_{0.51}In_{0.49}P$ cladding layer 16, having a thickness generally of 0.5 μm and an electron concentration of $1\times10^{18}/cm^3$, is formed on the n-contact layer 14. An $Al_{0.51}In_{0.49}P$ p-layer 18, having a thickness generally of 0.6 μm, is formed on the cladding layer 16. An electron reflecting layer 20 functioning as a quantum-wave interference layer is formed in the p-layer 18. A p-layer 18a, having a thickness generally of 0.1 μm and an electron concentration of $1\times10^{17}/cm^3$, and a p-layer 18b, having a thickness generally of 0.5 μm and a hole concentration of $1\times10^{18}/cm^3$, are formed contact to the incident plane and the output plane of the electron reflecting layer 20. A p-$Ga_{0.51}In_{0.49}P$ second contact layer 22 of p-type conduction, having a thickness generally of 0.1 μm and a hole concentration of $2\times10^{18}/cm^3$, is formed on the p-layer 18b. A p-GaAs first p-type contact layer 24 of p-type conduction, having a thickness generally of 0.1 μm and a hole concentration of $2\times10^{18}/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of gold and zinc (Au/Zn), having a thickness generally of 0.2 μm, is formed on some portion of the first contact layer 24. The substrate 10 has a diameter of 2.0 inches and the normal direction of its main surface is offset toward the [011] axis by 15 degree from the (100) plane.

The pn junction device 100 was manufactured by gas source molecular beam epitaxial deposition (GS-MBE), which is an epitaxial growth method performed under extremely a high vacuum condition. GS-MBE is different from a conventional MBE, which supplies group III and V elements both from the solid sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$. Alternatively, the LED 100 can be manufactured by metal organic chemical vapor deposition (MOCVD).

Figure 7A:
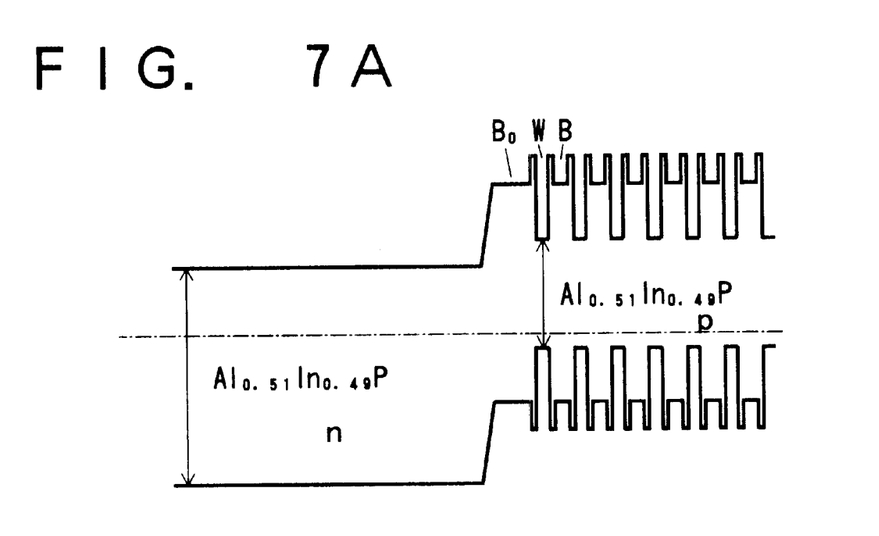
FIGS. 7A–7C are views showing energy diagrams of a pn junction device 100 (Example 1)
Figure 7B:
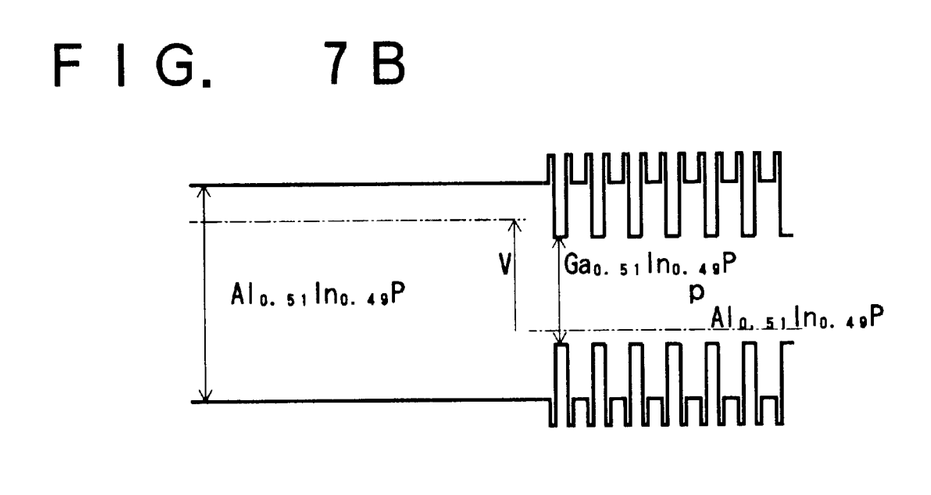
Figure 7C:
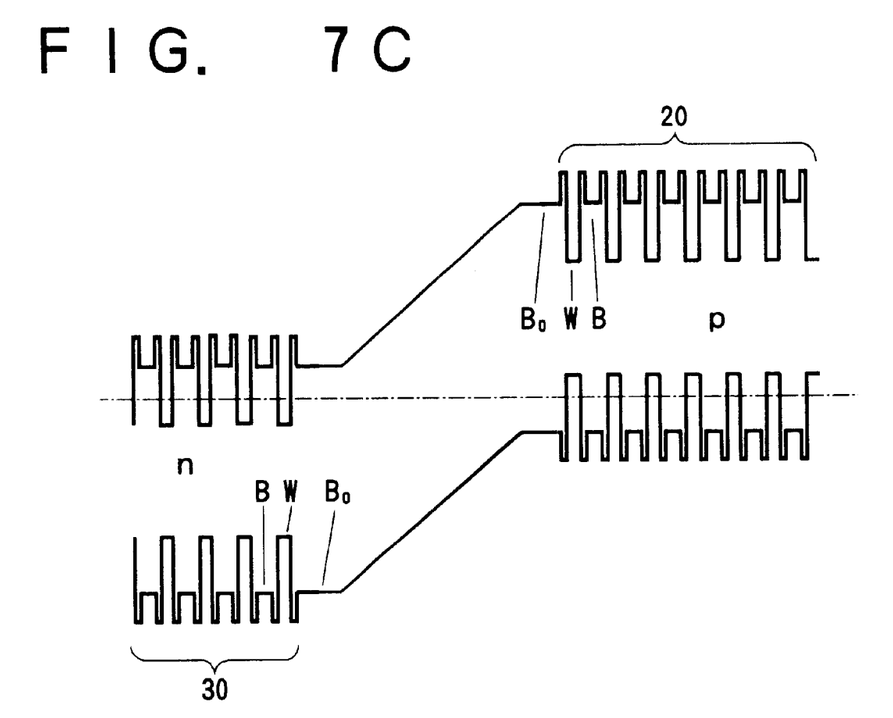

In the energy diagrams of FIGS. 7A, 7B and 7C, the n-layer 16, the p-layer 18a, and the electron reflecting layer 20 are shown. FIG. 7A shows an energy level of conduction and valence bands on the condition that no external voltage is applied to the device 100, and FIG. 7B shows the energy level on the condition that the external voltage is applied thereto. The electron reflecting layer 20, or a quantum-wave interference layer, has a multi-quantum layer structure with 15 periods of a p-$Ga_{0.51}In_{0.49}P$ well layer as a first layer W and a p-$Al_{0.51}In_{0.49}P$ barrier layer as a second layer B. A δ layer made of p-$Al_{0.33}Ga_{0.33}In_{0.33}P$ is formed at each interface between the first layer W and the second layer B. Thicknesses of the first layer W and the second layer B are respectively determined according to Eqs. 1 and 2. Only the first second layer $B_0$ is designed to have enough thickness to prevent conduction of carriers by tunneling effects. The δ layer is formed to have a thickness of 1.3 nm.

Accordingly, when the external voltage is applied to the device 100 in the forward direction, electrons injected from the n-layer 16 into the p-layer 18a are reflected effectively by the electron reflecting layer 20 and are not injected into the p-layer 18b. And the kinetic energy of electrons injected, when the external voltage is applied, exceeds the kinetic energy E which designs the electron reflecting layer 20 substantially, the electron reflecting layer 20 does not reflect electron but let them pass through. Consequently, I-V characteristic rises at the voltage when the applied external voltage exceeds a certain threshold.

Although the valence band of the electron reflecting layer 20 also has a multiple period of energy level, holes are designed not to be reflected thereby. The respective thickness of the first layer W and the second layer B in the reflecting layer 20 is designed to reflect electrons only. Therefore, holes injected from the p-layer 18b pass through the electron reflecting layer 20 thus reaching the n-layer 16.

I-V characteristic was measured varying the respective thickness of the first layer W and the second layer B. The thickness of the second layer B was fixed at 7 nm and that of the first layer W was varied. A minimum V/I ratio of I-V characteristic, or dynamic resistance, was obtained when the thickness of the first layer W was 5 nm. Then, I-V characteristic was measured fixing the thickness of the first layer W at 5 nm and varying that of the second layer B. When the second layer B has a thickness of 7 nm, dynamic resistance showed its minimum. As a result, the pn junction device 100 with the electron reflecting layer 20 was found to have a minimum dynamic resistance when the first layer W has a thickness of 5 nm and the second layer B has a thickness of 7 nm.

Figure 8:
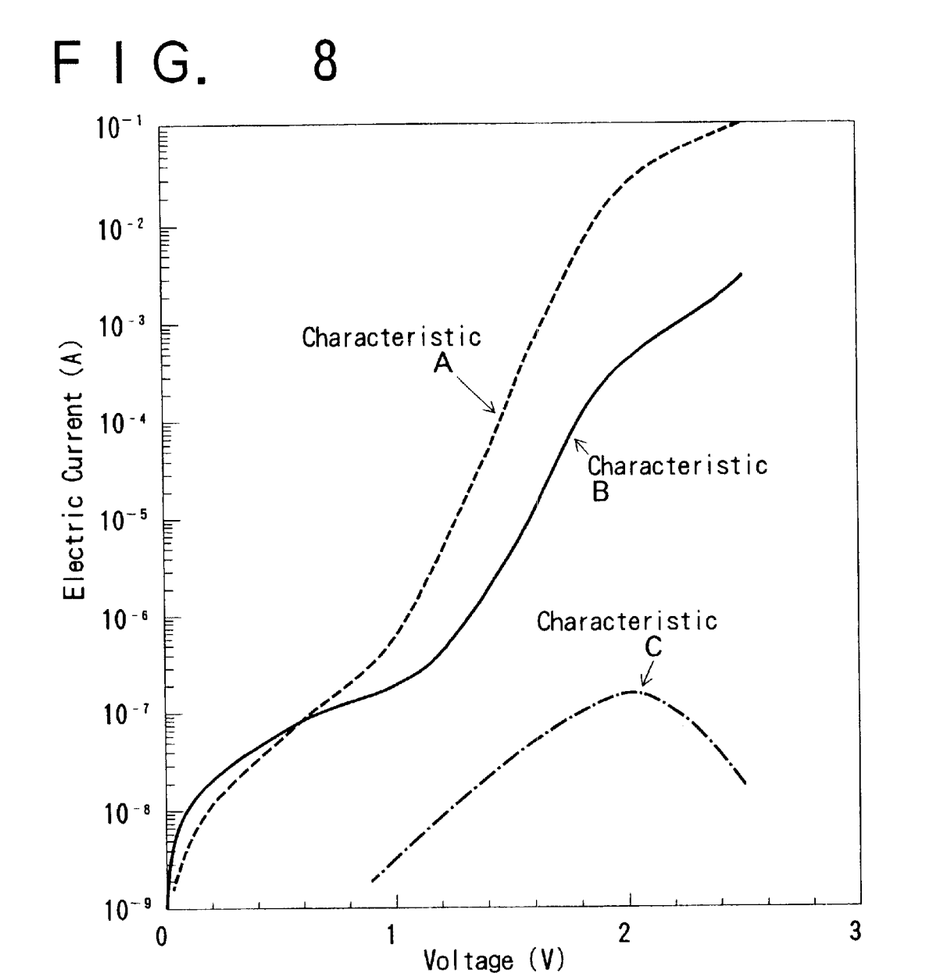
FIGS. 8 and 9 are views showing diagrams of a second exemplary I-V characteristic of a transistor (Examples 1)
Figure 9:
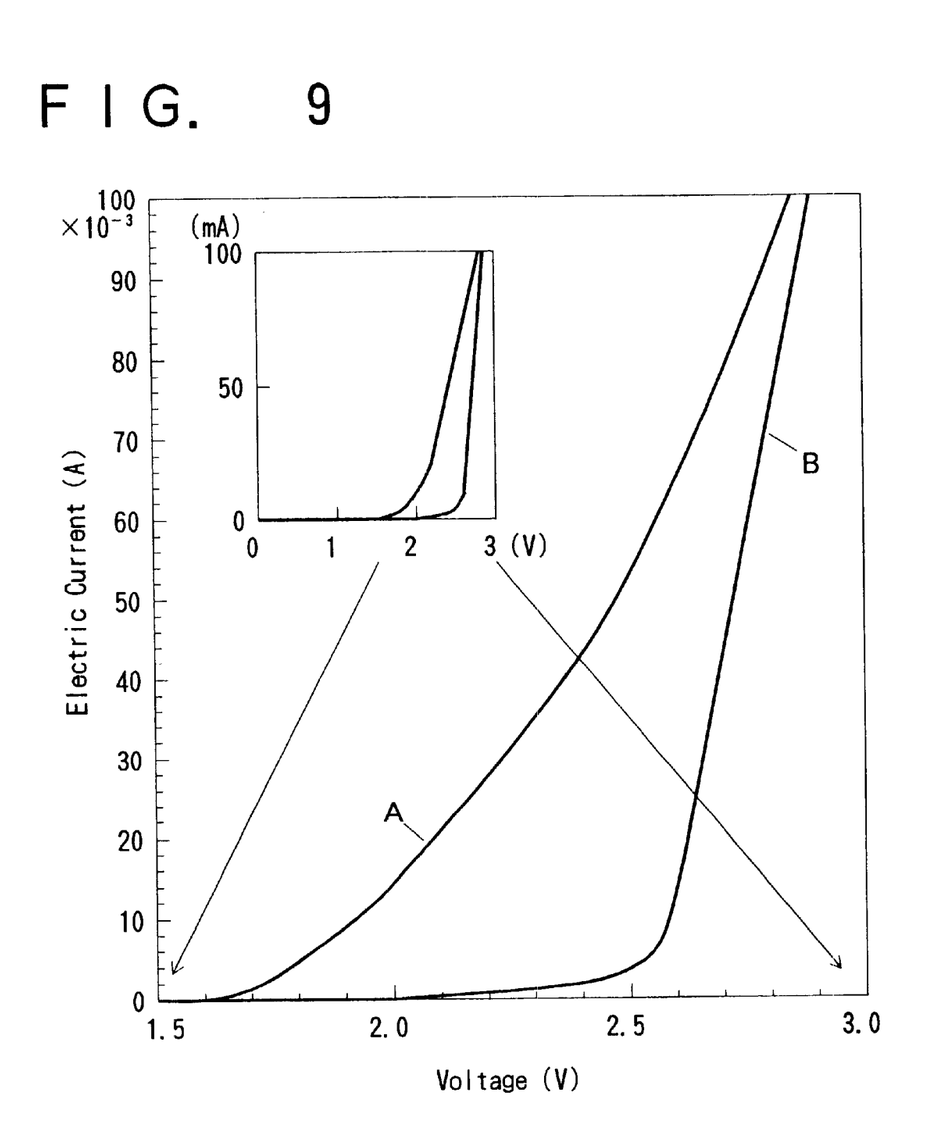

FIGS. 8 and 9 show I-V characteristic B of the device 100. For comparison, a device without the electron reflecting layer 20, or a pn junction device of the prior art, was manufactured and its I-V characteristic A was measured. FIG. 8 shows a region of an electric current of I-V characteristic A before it rises rapidly, and also shows that the electric current of the pn junction device 100 is suppressed compared to that of the prior device without an electron reflecting layer. Characteristic C in FIG. 8 shows a difference of the I-V characteristics A and B in the graph, which display logarithmic figures. When the external voltage is about 2V, C shows its peak, or the suppression of electric current is maximum, or a hundredfold of the minimum electric current. And when the external voltage is 2 V, the energy which injected electrons may have, or a potential energy which is obtained by subtracting the difference of quasi-Fermi energy levels in n-layer and p-layer from 2 V, exceeds the bottom of the conduction band of the second layer B and is consider to correspond to kinetic energy E of electrons used to design the thicknesses of the first layer W and the second layer B. FIG. 9 shows I-V characteristic by linear scale. A dynamic resistance of the pn junction device 100 is dropped to one-fourth compared to that of the prior device. This shows that by forming the quantum-wave interference layer as described above in a transistor and by applying the range of its I-V characteristic which varies sharply, a transistor having a larger amplification factor than that of a conventional transistor can be obtained.

EXAMPLE 2

Figure 10:
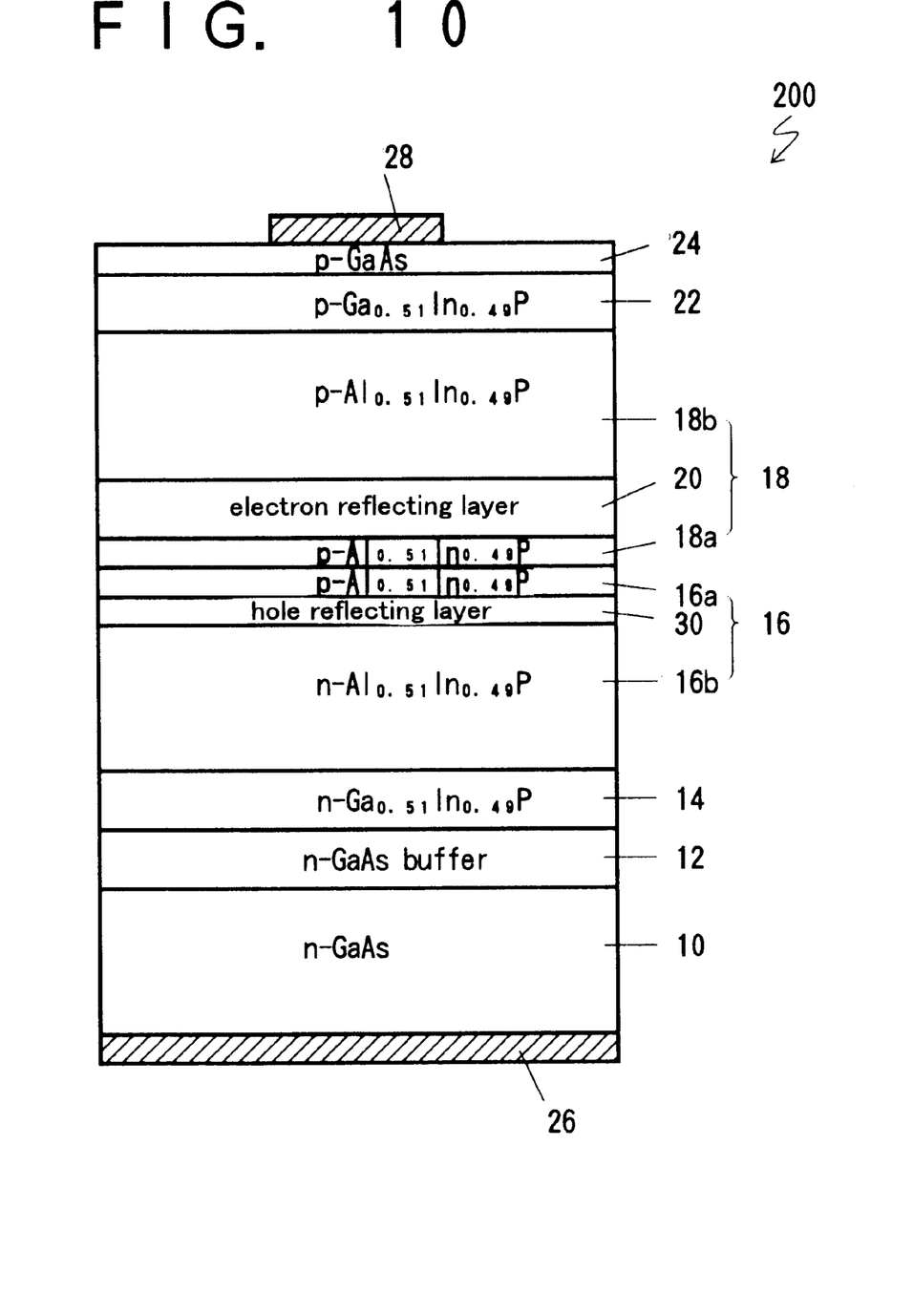
FIG. 10 is a sectional view showing a second exemplary structure of a transistor (Example 2)

FIG. 10 shows a pn junction device 200 used in the present embodiment. An electron reflecting layer 20 is formed in a p-layer 18, having the same structure as those of the electron reflecting layer 20 and the p-layer 18 in Example 1. And a hole reflecting layer 30, having the same structure as that of the electron reflecting layer 20, is formed in an n-layer 16. A p-layer 18a, which is connected to the incident plane of the electron reflecting layer 20 functioning as a quantum-wave interference layer, is designed to have enough thickness to prevent conduction of electrons by a tunneling effects. Also, a n-layer 16a, which is connected to the incident plane of the hole reflecting layer 30 functioning as a quantum-wave interference layer, is designed to have enough thickness to prevent conduction of holes by a tunneling effects. The hole reflecting layer 30 had as same structure as the electron reflecting layer 20 of the pn junction device 200. The thickness of the first layer W and the second layer B are designed to be 1.0 nm and 1.2 nm respectively to reflect holes effectively. As a result, the pn junction device 200 obtained dynamic resistance of one-sixth compared to the pn junction device without the electron reflecting layer 20 and the hole reflecting layer 30. This shows that by forming the quantum-wave interference layer as described above in a transistor and by applying the range of its I-V characteristic which varies sharply, a transistor having a larger amplification factor than that of a conventional transistor can be obtained.

EXAMPLE 3

Figure 11:
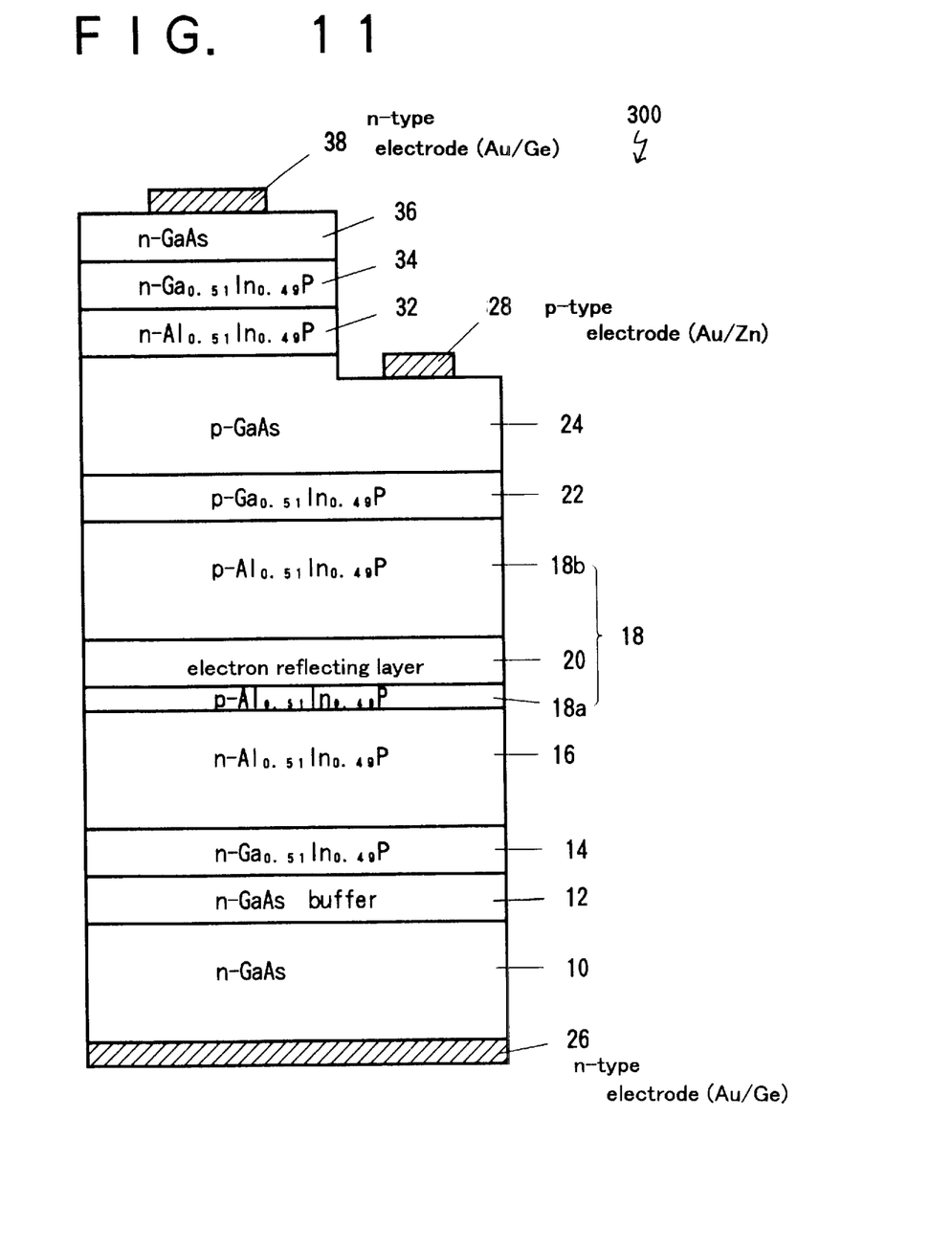
FIG. 11 is a sectional view showing a third exemplary structure of a bipolar transistor having an npn structure (Example 3)

FIG. 11 shows a bipolar transistor 300 used in the present embodiment. The bipolar transistor 300 has the same pn junction structure as that of the pn junction device 100 in Example 1, which is called an npn junction structure in this embodiment. The layers from a substrate 10 to a first p-type contact layer 24 which have a same structure as the layers from the substrate 10 to the first p-type contact layer 24 of the device 100 are formed. Then an n-layer 32 and n-type contact layers 34 and 36 are formed on the p-type contact layer 24 in sequence, and electrodes 28 and 38 were formed on a portion of an upper surface of the n-type contact layer 36 and on a portion of the first p-type contact layer 24 exposed by etching, respectively. The electrodes 26, 28 and 38 of the transistor 300 are an emitter electrode, a base electrode, and a collector electrode, respectively. By using a grounded-emitter and by applying a bias voltage of around 2.7 V, the transistor provides an amplification factor of fourfold compared with a transistor having a conventional structure.

Similarly, by forming a hole reflecting layer described in Example 2 in n-layer of a bipolar transistor having a pnp junction structure, the amplification factor can be excellently improved compared with a conventional transistor. Further, by forming an electron reflecting layer in a base region and forming a hole reflecting layer in an emitter region in a transistor having an npn junction structure, and by forming a hole reflecting layer in a base region and forming an electron reflecting layer in an emitter region in a transistor having a pnp junction structure, the amplification factor can be improved sharply compared with a conventional transistor.

EXAMPLE 4

Figure 12:
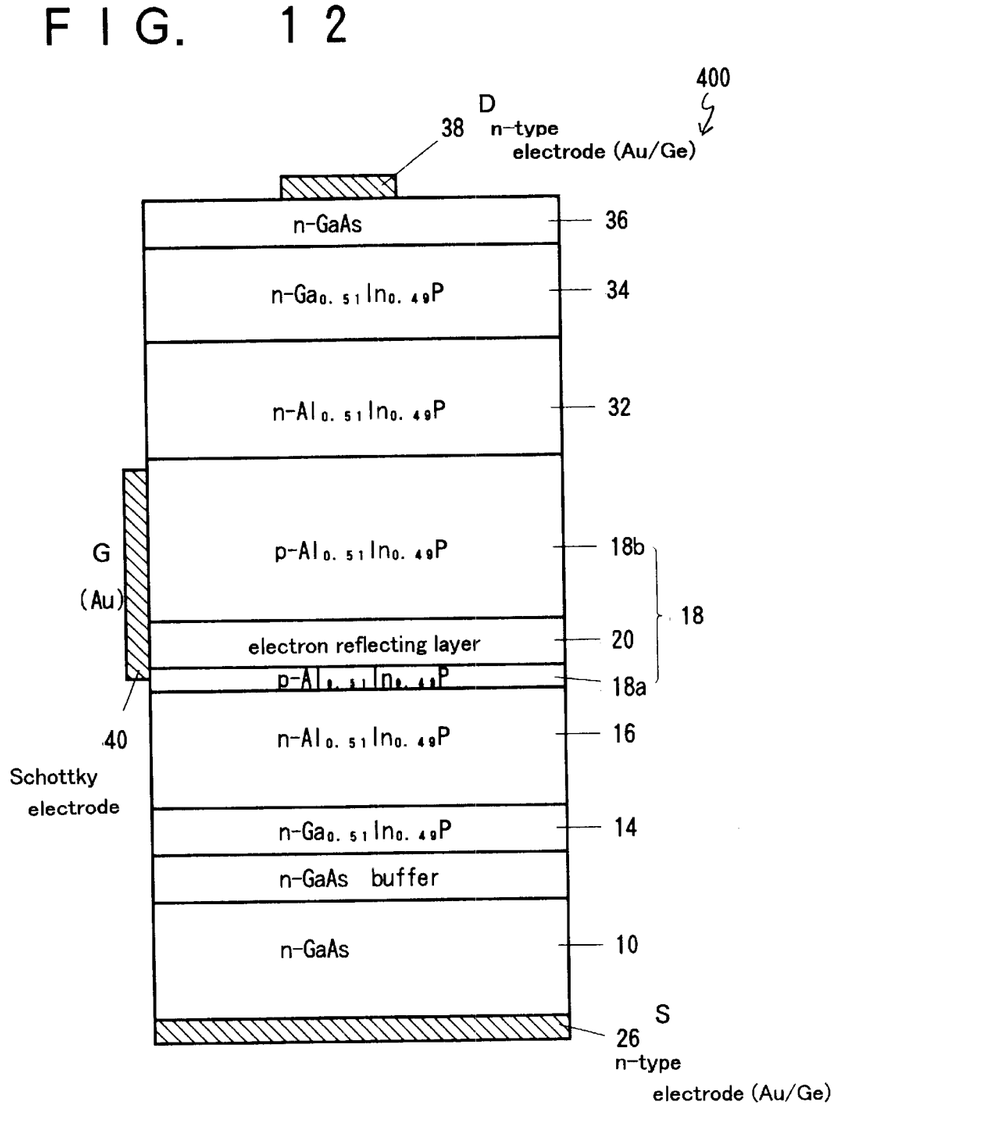
FIG. 12 is a sectional view showing a fourth exemplary structure of a field effect transistor having a source region and a drain region both functioning as n-layers (Example 4)

FIG. 12 shows a field effect transistor 400 used in the present embodiment. The field effect transistor 400 has the same pn junction structure as in Example 1. The transistor 400 is a MESFET which has a source region named S and a drain region named D both functioning as n-layers. Electric current does not flow in the region sandwiched by the source (S) and the drain (D) of the transistor 400 until the external voltage applied to the gate (G) exceeds a certain threshold. Accordingly, an efficiency of the device as a MESFET can be improved.

Figure 13A:
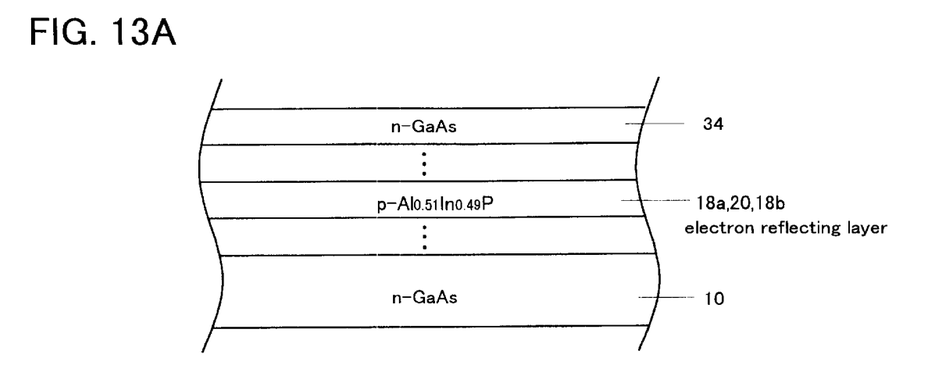
FIGS. 13A–13C are views showing a method for manufacturing the field effect transistor of Example 4.
Figure 13B:
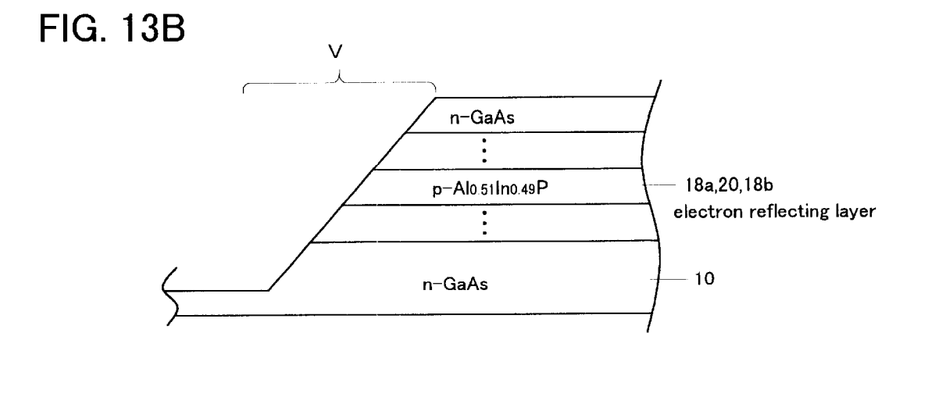
Figure 13C:
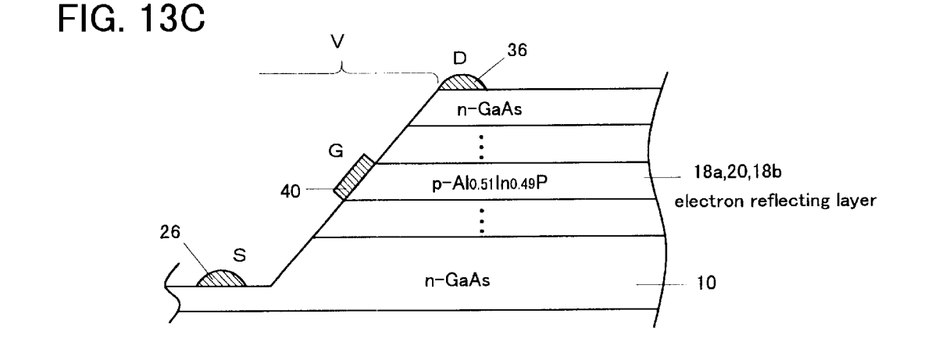

The method for manufacturing the field effect transistor 400 is shown by FIGS. 13A to 13C. As shown in FIG. 13A, the transistor 400 has the same structure as the bipolar transistor 300 in Example 3. Then, as shown in FIG. 13B, a declined plane V was formed by etching a portion of a substrate 10 to an n-type contact layer 34. A Schottky electrode 40 made of gold (Au) was formed at an exposed portion of a p-layers 18a and 18b and an electron reflecting layer 20 on the declined plane V, and electrodes 26 and 38 are formed at a source (S) and a drain (D) as shown in FIG. 13C.

Similarly, by forming a hole reflecting layer, having the same structure as that of a bipolar transistor having a pnp junction structure in Example 2, in the field effect transistor having a source and a drain regions of p-type conduction, the amplification factor can be improved sharply compared with a conventional transistor.

In the embodiment, MESFET is explained. Alternatively, MOSFET having the same structure can be applied.

In the present invention, embodiments of devices with δ layers are shown as Examples 1–4. The reflectivity is more improved by δ layers. Alternatively, a multi-quantum well (MQW) structure without a δ layer can be applied to a device although its reflectivity will be lowered.

Further, in Examples 1–4, the quantum-wave interference layer and the δ layer was made of ternary compounds including $Ga_{0.51}In_{0.49}P$ and quaternary compounds including $Al_{0.33}Ga_{0.33}In_{0.33}P$, respectively. Alternatively, the quantum-wave interference layer having a δ layer between each layers can be made of quaternary compounds such as $Al_xGa_yIn_{1-x-y}P$ or $Al_xGa_yIn_{1-x-y}As$, selecting arbitrary composition ratio within the range of $0 \leq x \leq 1$, $0 \leq y \leq 1$, and $0 \leq x+y \leq 1$.

As another alternative, the quantum-wave interference layer can be made of group III-V compound semiconductor, group II-VI compound semiconductors, Si and Ge, and semiconductors of other hetero-material. The desirable compositions are as follows. Each combinations is represented by a composition of a layer having a wide band width / a layer having a narrow band width // a substrate. And x and y are arbitrary values wherein $0 \leq x \leq 1$ and $0 \leq y \leq 1$, as long as they are not specified.

<1> $Al_xIn_{1-x}P/Ga_yIn_{1-y}P//GaAs$
<2> $Al_xGa_{1-x}As/GaAs//GaAs$
<3> $Ga_xIn_{1-x}P/InP//InP$
<4> $Ga_xIn_{1-x}P/Ga_xIn_{1-x}As//GaAs$
<5> $AlAs/Al_xGa_{1-x}As//GaAs$ ($0.8 \leq x \leq 0.9$)
<6> $InP/Ga_xIn_{1-x}As_yP_{1-y}//GaAs$
<7> $Si/SiGe_x//arbitrary material$ ($0.1 \leq x \leq 0.3$)
<8> $Si/SiGe_xC_y//arbitrary material$ ($0.1 \leq x \leq 0.3$, $0 < y \leq 0.1$)
<9> $Al_{x1}Ga_{y1}In_{1-x1-y1}N/Al_{x2}Ga_{y2}In_{1-x2-y2}N//Si$, SiC, GaN, or sapphire ($0 \leq x_1, x_2, y_1, y_2, x_1+y_1, x_2+y_2 \leq 1$)

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Oct. 23, 1998, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A transistor comprising:

a quantum-wave interference layer having plural periods of a pair of a first layer and a second layer, said second layer having wider band gap than said first layer, and said quantum-wave interference layer being formed in a base region or a channel region; and wherein each thickness of said first and said second layers is determined by multiplying by odd number one fourth of wavelength of quantum-wave of injected minority carriers in each of said first and said second layers.

2. A transistor according to claim 1, comprising:

a δ layer for sharply-varying energy band, being formed between said first and said second layers, and thickness of said δ layer being substantially thinner than the thickness of said first and said second layers.

3. A transistor according to claim 1, said injected minority carriers being existing around the lowest energy level of said second layer.

4. A transistor according to claim 2, said injected minority carriers being existing around the lowest energy level of said second layer.

5. A transistor according to claim 1, wherein said wavelength $\lambda_W$ in said first layer is determined by a formula $\lambda_W = h/[2m_W(E+V)]^{1/2}$, said wavelength $\lambda_B$ in said second layer is determined by a formula $\lambda_B = h/(2m_B E)^{1/2}$, said thickness of said first layer $D_W$ is determined by a formula $D_W = n_W \lambda_W/4$, and said thickness of said second layer $D_B$ is determined by a formula $D_B = n_B \lambda_B/4$, where h, $m_W$, $m_B$, E, V, and $n_W$ and $n_B$ represent a Plank's constant, effective mass of said carrier in said first layer, effective mass of said carrier in said second layer, kinetic energy of carriers injected into said second layer, potential energy of said second layer to said first layer, and odd number, respectively.

6. A transistor according to claim 2, wherein said wavelength $\lambda_W$ in said first layer is determined by a formula $\lambda_W = h/[2m_W(E+V)]^{1/2}$, said wavelength $\lambda_B$ in said second layer is determined by a formula $\lambda_B = h/(2m_B E)^{1/2}$, said thickness of said first layer $D_W$ is determined by a formula $D_W = n_W \lambda_W/4$, and said thickness of said second layer $D_B$ is determined by a formula $D_B = n_B \lambda_B/4$, where h, $m_W$, E, V, and $n_W$, and $n_W$ $n_B$ represent a Plank's constant, effective mass of said carrier in said first layer, effective mass of said carrier in said second layer, kinetic energy of carriers injected into said second layer, potential energy of said second layer to said first layer, and odd number, respectively.

7. A transistor having a quantum-wave interference layer with plural periods of a pair of a first layer and a second layer, said second layer having a wider band gap than said first layer, and said quantum-wave interference layer being formed in a base region or a channel region, comprising:

a plurality of partial quantum-wave interference layer $I_k$ with $T_k$ periods of a pair of said first layer and said second layer being displaced in series by varying k as 1, 2, . . . ; and wherein index k of said plurality of said partial quantum-wave interference layers corresponds to index k of kinetic energy level $E_k$ and said first and second layers have thicknesses of $n_{Wk}\lambda_{Wk}/4$ and $n_{Bk}\lambda_{Bk}/4$, respectively, where $E_k+V$ and $E_k$, $\lambda_{Wk}$ and $\lambda_{Bk}$, $n_{Wk}$ and $n_{Bk}$ represent kinetic energy level of minority carriers injected into respective said first layer and said second layer, quantum-wave wavelength of carriers flowing into respective said first layer and said second layer, and odd numbers, respectively, and $\lambda_{Wk}$ and $\lambda_{Bk}$ are determined by functions of $E_k+V$ and $E_k$, respectively.

8. A transistor having a quantum-wave interference layer with plural periods of a pair of a first layer and a second layer, said second layer having a wider band gap than said first layer, and said quantum-wave interference layer being formed in a base region or a channel region, comprising:

a plurality of partial quantum-wave interference layer, each of said partial quantum-wave interference layer having serial pairs of said first layer and said second layer with serial pairs of thicknesses of $(n_{W1}\lambda_{W1}/4, n_{B1}\lambda_{B1}/4), \ldots, (n_{Wk}\lambda_{Wk}/4, n_{Bk}\lambda_{Bk}/4), \ldots, (n_{Wj}\lambda_{Wj}/4)$ where $E_k+V$ and $E_k$, $\lambda_{Wk}$ and $\lambda_{Bk}$, $n_{Wk}$ and $n_{Bk}$ represent kinetic energy level of minority carriers injected into respective said first layer and said second layer, quantum-wave wavelength of carriers injected into respective said first layer and said second layer, and odd numbers, respectively, and $\lambda_{Wk}$ and $\lambda_{Bk}$ are determined by functions of $E_k+V$ and $E_k$, respectively.

9. A transistor according to claim 7, comprising:

a δ layer for sharply varying energy band, being formed between said first and said second layers, and thickness of said δ layer being substantially thinner than the thickness of said first and second layers.

10. A transistor according to claim 8, comprising:

a δ layer for sharply varying energy band, being formed between said first and said second layers, and thickness of said δ layer being substantially thinner than the thickness of said first and said second layers.

11. A transistor according to claim 1, wherein a quantum-wave incident plane in said quantum-wave interference layer is said second layer having enough thickness to prevent conduction of minority carriers by a tunneling effect.

12. A transistor according to claim 2, wherein a quantum-wave incident plane in said quantum-wave interference layer is said second layer having enough thickness to prevent conduction of minority carriers by a tunneling effect.

13. A transistor according to claim 7, wherein a quantum-wave incident plane in said quantum-wave interference layer is said second layer having enough thickness to prevent conduction of minority carriers by a tunneling effect.

14. A transistor according to claim 1, wherein said quantum-wave interference layer is formed in said base region, and said transistor is a bipolar transistor.

15. A transistor according to claim 7, wherein said quantum-wave interference layer is formed in said base region, and said transistor is a bipolar transistor.

16. A transistor according to claim 8, wherein said quantum-wave interference layer is formed in said base region, and said transistor is a bipolar transistor.

17. A transistor according to claim 1, wherein said quantum-wave interference layer is formed in said channel region, and said transistor is a field effect transistor.

18. A transistor according to claim 7, wherein said quantum-wave interference layer is formed in said channel region, and said transistor is a field effect transistor.

19. A transistor according to claim 8, wherein said quantum-wave interference layer is formed in said channel region, and said transistor is a field effect transistor.

* * * * *